(12) United States Patent
McCall et al.

(10) Patent No.: US 6,172,569 B1
(45) Date of Patent: Jan. 9, 2001

(54) TRANSCONDUCTANCE FILTER CONTROL SYSTEM

(75) Inventors: Kevin J. McCall, Superior, CO (US); George R. Spaulding, Jr., Limerick (IE)

(73) Assignee: Analog Devices, Inc., Norwood, MA (US)

( * ) Notice: Under 35 U.S.C. 154(b), the term of this patent shall be extended for 0 days.

(21) Appl. No.: 09/270,399

(22) Filed: Mar. 16, 1999

(51) Int. Cl.[7] ....................................... H03F 3/191
(52) U.S. Cl. .................................... 330/303; 330/279
(58) Field of Search ................................. 330/279, 285, 330/303, 305, 306

(56) References Cited

U.S. PATENT DOCUMENTS

| | | | |
|---|---|---|---|
| 5,121,081 * | 6/1992 | Hori ........................................ | 330/279 |
| 5,182,527 * | 1/1993 | Nakanishi et al. ....................... | 330/285 |
| 5,334,945 * | 8/1994 | Yokoya et al. .......................... | 330/279 |
| 5,337,006 * | 8/1994 | Miyazaki ................................. | 330/279 |
| 5,606,284 * | 2/1997 | Tamesue et al. ........................ | 330/279 |
| 5,896,064 * | 4/1999 | Kaku ....................................... | 330/279 |
| 6,002,717 * | 12/1999 | Gaudet ................................... | 375/232 |

* cited by examiner

Primary Examiner—Robert Pascal
Assistant Examiner—Khanh Van Nguyen
(74) Attorney, Agent, or Firm—Kirk Teska; Iandiorio & Teska

(57) ABSTRACT

A transconductance filter control system for compensating for drift in transconductance of a slave transconductance amplifier in a continuous time transconductance filter including: a master transconductance amplifier having an output which is a function of its transconductance and a control input for controlling the transconductance of the master transconductance amplifier; a tuning signal source for providing a tuning signal representative of a preselected characteristic of the transconductance filter; a comparing circuit, responsive to any deviation from a predetermined difference between the tuning signal and the output of the master transconductance amplifier, representative of a deviation of the transconductance of the master transconductance amplifier, for providing a compensation signal; and a circuit for applying the compensation signal to the control input of the master transconductance amplifier and to the control input of the slave transconductance amplifier in the transconductance filter to adjust the transconductance of both the master and slave transconductance amplifiers and restore the predetermined difference between the tuning signal and the output of the master transconductance amplifier.

22 Claims, 3 Drawing Sheets

TRANSCONDUCTANCE FILTER CONTROL SYSTEM

FIELD OF INVENTION

This invention relates to a transconductance filter control system and more specifically to such a filter control system which automatically compensates for variations in transconductance gain.

BACKGROUND OF INVENTION

Transconductance filters are often used in electronic circuits to perform various filtering functions. Typically, these filters incorporate a transconductance amplifier which converts a voltage input signal into a controlled current signal, where the controlled current signal produced is equal to the product of the transconductance gain ($g_m$) of the amplifier and the voltage input signal applied to the amplifier. This controlled current signal is then applied to a capacitor to produce an output voltage. Since the voltage across this capacitor varies in accordance with the rate of the change of the current passing through the capacitor and the current passing through the capacitor varies in accordance with the voltage applied to the transconductance amplifier, a frequency dependent filter circuit is created.

The characteristics (e.g. maximum gain, unity gain frequency, etc.) of this transconductance filter circuit are tunable via a control signal which is applied to the transconductance amplifier. Various methods can be employed to generate this control signal. For example, a simple potentiometer can be used to adjust the amplitude of the analog control signal applied to this transconductance amplifier. Alternatively, a digital-to-analog converter (DAC) can be used to convert a digital control signal to an analog signal prior to applying it to the transconductance amplifier, thus allowing digital control of the transconductance filter characteristics. By varying the control signal applied to the transconductance amplifier, the maximum gain of a transconductance filter can be adjusted along the gain axis which, in turn, shifts the unity gain frequency along frequency axis.

There are certain known shortcomings associated with these transconductance filters, including the known instability of the amplifier's transconductance gain ($g_m$). Since this transconductance gain varies in accordance with several variables, such as temperature variations, process variations (such as transistor doping levels) and production variations (such as transistor channel width, transistor channel length, etc.), a transconductance filter circuit is prone to uncontrollable filter characteristic shifts which severely effect the stability and overall usability of the filter.

Various attempts have been made to improve the stability of these transconductance filter circuits. Since the filter characteristics of the circuit can be adjusted by varying the control signal applied to the transconductance amplifier, the effects of temperature, process and product variations on transconductance gain can be offset (or nullified) by varying the control signal applied to the transconductance amplifier. Therefore, it is possible to offset these filter drift characteristics by manually adjusting the control signal applied to the transconductance amplifier. However, manual adjustment is not always possible or practical.

Alternatively, an automatic transconductance filter controller circuit may incorporate a phase-lock loop (PLL) or delay-lock loop (DLL) to automatically adjust the control signal applied to the transconductance amplifier, thereby automatically offsetting the unwanted effects that temperature, process and product variations have on transconductance gain ($g_m$). Specifically, by utilizing a PLL or DLL which incorporates one or more slave transconductance amplifiers within its loop, the output of this PLL or DLL is a signal which varies in accordance with the same variables (temperature, process and product) that affect the conductance gain ($g_m$) of the transconductance filter circuit. Therefore, by providing this PLL or DLL generated signal to the control input terminal of the transconductance amplifier utilized in the transconductance filter circuit, the sporadic and uncontrollable drift characteristics of the filter circuit can be minimized.

However, there are several disadvantages associated with the use of this PLL or DLL as an automatic control circuit for a transconductance filter circuit. Specifically, these disadvantages include: the additional power required to drive such a PLL or DLL circuit; the additional wafer size (or PC board size) required to construct such a circuit; the complex design criteria and time required to construct such a PLL or DLL circuit; and the undesirable coupling of the PLL/DLL clock signal with the transconductance filter circuit which results in the imposition of PLL/DLL induced noise into the output of the transconductance filter circuit.

SUMMARY OF INVENTION

It is therefore an object of this invention to provide a transconductance filter control system which automatically compensates for variations in transconductance gain.

It is a further object of this invention to provide such a system which automatically compensates for transconductance amplifier temperature, process or production variations.

It is a further object of this invention to provide such a system which avoids problems associated with clocked feedback loops, such as high power consumption, large silicon wafer or circuit size, complex design criteria, and clock-induced noise coupling.

It is a further object of this invention to provide such a system which incorporates an analog feedback loop.

This invention results from the realization that a truly simple control system for a continuous time transconductance filter can be effected without the use of a phase lock loop or a delay lock loop by pairing a slave transconductance amplifier in the transconductance filter with a master transconductance amplifier in the control system and creating a compensation signal to compensate for any changes in transconductance of the master transconductance amplifier and applying the same compensation signal to also adjust the transconductance of the paired slave transconductance amplifier in the transconductance filter.

This invention features a transconductance filter control system for compensating for drift and transconductance of a slave transconductance amplifier in a continuous time transconductance filter including a master transconductance amplifier having an output which is a function of its transconductance and a control input for controlling the transconductance of the master transconductance amplifier, a tuning signal source for providing a tuning signal representative of a preselected characteristic of the transconductance filter, a comparing circuit, responsive to any deviation from a predetermined difference between the tuning signal and the output of the master transconductance amplifier, representative of a deviation of the transconductance of the master transconductance amplifier, for providing a compensation signal, and means for applying the compensation signal to the control input of the master transconductance amplifier and to the control input of the slave transconductance amplifier in the transconductance filter to adjust the transconductance of both the master and slave transconductance amplifiers and restore the predetermined difference between the tuning signal and the output of the master transconductance amplifier.

In a preferred embodiment, the tuning signal source may be a static source. Alternatively, the tuning signal source may be a selectively variable source. The control system and slave transconductance amplifier may be CMOS circuits. Additionally, the master and slave transconductance amplifiers may be matched CMOS circuits. The master transconductance amplifier may have a fixed input voltage. This fixed input voltage may be a band-gap reference voltage. The comparing circuit may include a differential amplifier. The tuning signal source may be a digital to analog converter. The predetermined difference between the tuning signal and the output of the master transconductance amplifier may be zero. The means for applying the compensation signal to the control input of the master transconductance amplifier may be a current mirror circuit.

The output of the master transconductance amplifier may be a voltage which is applied across a first load device and the tuning signal may be a voltage which is applied across a second load device. These load devices may be resistors. The output of the master transconductance amplifier and the tuning signal may be current signals applied across a first and second load device. These first and second load devices may be capacitors. The master transconductance amplifier may have a first and second output terminal. The tuning signal source may have a first and second output terminal. The comparing circuit may have a first and second input channel, each channel having a first and second input terminal. The first load device may be applied across the input terminals of the first channel and the second load device may be applied across the input terminals of the second channel. The first output terminals of the master transconductance amplifier and the tuning signal source may be connected to the first input terminal of the first input channel and the second output terminals of the master transconductance amplifier and the tuning signal source may be connected to the first input terminal of the second input channel.

The tuning signal source may be a fixed voltage source. The comparing circuit may have a first and second input channel and each channel may have a first and second input terminal, where a load device may be applied across the input terminals of the first channel. This load device may be a capacitor. The fixed voltage source may be applied across the first and second input terminals of the second input channel. The output of the master transconductance amplifier may be applied to the first input terminal of the first input channel and a digital to analog converter may be connected to this first input terminal of this first input channel to adjust the preselected characteristic of the transconductance filter.

DISCLOSURE OF PREFERRED EMBODIMENT

Other objects, features and advantages will occur to those skilled in the art from the following description of a preferred embodiment and the accompanying drawings, in which.

The manner in which the control signal for a transconductance filter circuit is generated has a severe impact on the quality of the filter circuit output signal. By utilizing a control circuit which generates its control signal via static means, a transconductance filter control circuit can be created which avoids the shortcomings of those which employ phase lock loop (PLL) or delay lock loop (DLL) based control systems.

Figure 1:
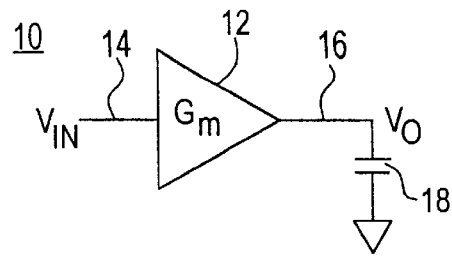
FIG. 1 is a schematic view of a prior art transconductance filter circuit.
Figure 2:
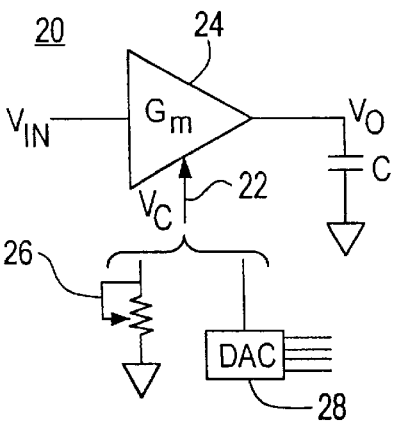
FIG. 2 is a schematic view of a prior art transconductance filter circuit incorporating a manual transconductance control circuit.
Figure 3:
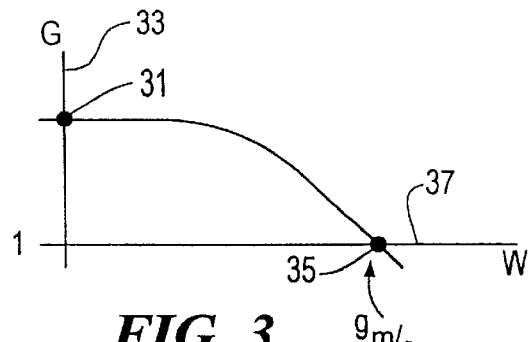
FIG. 3 is a graph showing the frequency response of a prior art transconductance filter.

As discussed in the Background of the Invention above, prior art transconductance filter 10, FIG. 1, incorporates transconductance amplifier 12 to convert an input signal on line 14 into a controlled current signal on line 16 which is applied across capacitor 18 to produce an output voltage $V_o$. The characteristics of transconductance filter 20, FIG. 2, are tunable via a control signal $V_c$ on line 22, which is applied to transconductance amplifier 24. This control signal $V_c$ can be adjusted by various devices such as potentiometer 26 or digital to analog converter 28. By varying the control signal $V_c$ applied to the transconductance amplifier 24, the maximum gain 31, FIG. 3, of the transconductance filter can be adjusted along the gain axis 33 which, in turn, shifts the unity gain frequency 35 along the frequency axis 37.

Figure 4:
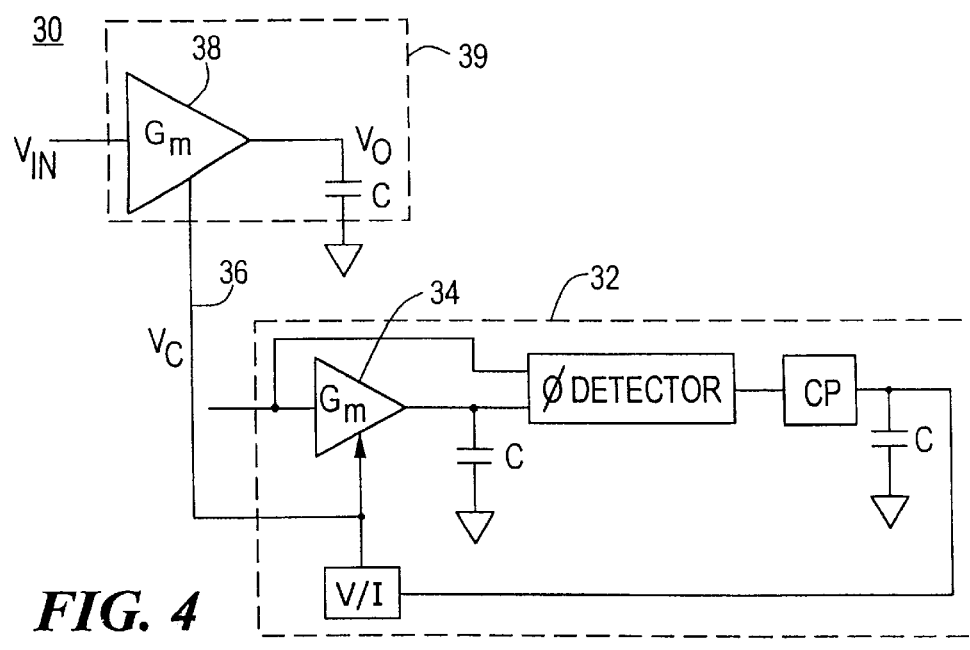
FIG. 4 is a schematic view of a prior art transconductance filter circuit incorporating a phase look loop based automatic transconductance control circuit.

Since the transconductance gain of transconductance amplifiers varies in accordance with several variables, transconductance filters are prone to uncontrollable filter characteristic shifts. Various attempts have been made to minimize this undesirable shifting. Automatic transconductance filter controller circuit 30, FIG. 4, incorporates a phase-lock loop (PLL) 32, which incorporates one or more slave transconductance amplifiers 34, to automatically adjust control signal $V_c$ on line 36 applied to transconductance amplifier 38 utilized in transconductance filter 39. However, as stated in the Background of the Invention, there are several disadvantages associated with the use of a phase-lock loop in an automatic control circuit for a transconductance filter circuit.

Figure 5:
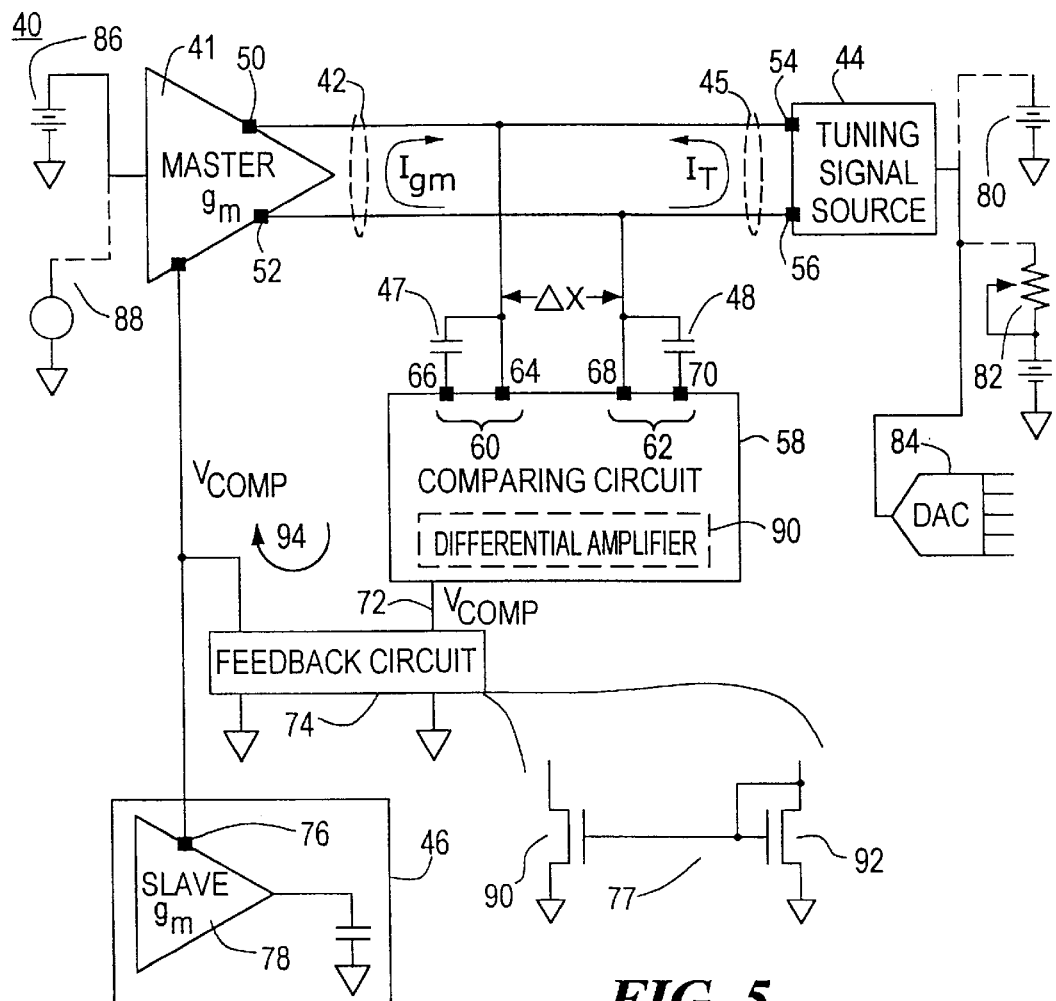
FIG. 5 is a schematic view of the transconductance filter control system of this invention in which the output of the master transconductance amplifier and the tuning signal are currents.

In one preferred current based embodiment, transconductance filter control system 40, FIG. 5, in accordance with this invention, includes master transconductance amplifier 41 having an output $I_{gm}$ on lines 42 which is a function of its transconductance. There is also a control input 43 for controlling the transconductance of the master transconductance amplifier 41. Tuning signal source 44 provides a tuning signal $I_t$ on lines 45 representative of a preselected characteristic of the transconductance filter 46. Current signals $I_{gm}$ and $I_t$ are applied across a first and second load device 47 and 48. Typically these load devices 47 and 48 are capacitors.

The master transconductance amplifier 41 has first and second output terminals 50 and 52. The tuning signal source 44 has first and second output terminals 54 and 56. The comparing circuit 58 has first and second input channels 60 and 62. The first channel 60 has first and second input terminals 64 and 66 and the second channel 62 has first and second input terminal 68 and 70. The first load device, capacitor 47 is applied across the input terminals 64 and 66 of the first channel 60 and the second load device, capacitor 48 is applied across the input terminals 68 and 70 of the second channel 62. The first output terminals 50 and 54 of the master transconductance amplifier 41 and the tuning signal source 44 are connected to the first input terminal 64 of the first input channel 60. The second output terminals 52 and 56 of the master transconductance amplifier 41 and the tuning signal source 44 are connected to the first input terminal 68 of the second input channel 62. Since the comparing circuit 58 employed in the transconductance filter control system 40 has an infinite impedance at its input terminals, any current generated by master transconductance amplifier 41 and tuning signal source 44 is not sunk by comparing circuit 58. Instead, it merely charges (or discharges) the capacitors 47 and 48, thus varying the voltage sensed by the first and second input channels 60 and 62 of comparing circuit 58.

In steady state, the current generated by the first terminal 50 of the master transconductance amplifier 41 is equal to the current absorbed by the first terminal 54 of the tuning signal source 44. Additionally, the current generated by the second terminal 52 of the master transconductance amplifier 41 is equal to the current absorbed by the second terminal 56 of the tuning signal source 44.

Any change in the tuning signal $I_t$ at 45 which indicates a desired change in the preselected filter characteristic of the filter circuit 46 being controlled, or any change in the temperature or other ambient conditions which affect transconductance gain of transconductance amplifier 41, creates a mismatch between the current produced by master transconductance amplifier 41 and tuning signal source 44. This, in turn, varies the voltages appearing across capacitors 47 and 48 and being sensed by input channels 60 and 62. This variation of the voltages appearing across capacitors 47 and 48 varies the predetermined difference, $\Delta X$, between input channels 60 and 62.

Comparing circuit 58, responsive to any variation of this predetermined difference, $\Delta X$, which represents a deviation of the transconductance of the master transconductance amplifier 41, provides compensation signal $V_{comp}$ on line 72. Feedback circuit 74, such as current mirror 77, provides compensation signal $V_{comp}$ on line 72 to the control input 43 of the master transconductance amplifier 41 and to the control input 76 of paired slave transconductance amplifier 78 in the continuous time transconductance filter 46. Compensation signal $V_{comp}$ adjusts the transconductance of both master and slave transconductance amplifiers 41 and 78 to restore the predetermined difference, $\Delta X$, between the voltage on capacitors 47 and 48. Therefore, compensation signal $V_{comp}$ on line 72 varies in accordance with any deviation in predetermined difference ($\Delta X$) sensed by comparing circuit 58 to adjust system 40 into steady state.

Unlike the prior art previously discussed which utilizes either manual adjustment or automatic adjustment via a phase lock loop or a delay lock loop, transconductance filter control system 40 provides automatic transconductance filter control through the use of analog components (master transconductance amplifier 41, comparing circuit 58, and feedback circuit 74). This creates a system 40 which automatically compensates for temperature, product and process-based variations and provides a low-noise compensation signal $V_{comp}$ at 72 to transconductance filter 46. Due to paired transconductance amplifiers 41 and 78, $V_{comp}$ varies according to the same temperature, product and process variables, thus eliminating the resulting drift of the preselected filter characteristic.

Tuning signal source 44 is a static source 80, such as a fixed D.C. voltage, a selectively variable source 82, such as a potentiometer in series with a D.C. voltage, source, or a digital to analog convertor 84. Control system 40, including slave transconductance amplifier 46, are preferably Complimentary Metal Oxide Semiconductor (CMOS) circuits.

Additionally, master and slave transconductance amplifiers 41 and 78 are also preferably matched CMOS circuits. This is accomplished by etching all components of both circuits on one silicon wafer to ensure that both amplifiers are equally affected by any temperature variation or change in other ambient conditions, thus creating a matched transconductance amplifier pair.

Master transconductance amplifier 41 has a fixed input voltage, such as a fixed D.C. voltage supply 86, or a band-gap reference voltage 88. Comparing circuit 58 includes differential amplifier 90 for comparing the voltage on capacitor 47 to the voltage on capacitor 48. The predetermined difference, $\Delta X$, between these two voltages is preferably zero. Feedback circuit 74, which supplies compensation signal $V_{comp}$ on line 72 to the control input 43 of the master transconductance amplifier 41, is a current mirror circuit 77 or any other equivalent circuit.

By design, current mirror 77 generates, on second transistor 90, a current which matches that which passes through its first transistor 92. Therefore, current mirror 77 "mirrors" compensation signal $V_{comp}$ on line 72, which passes through first transistor 92, and provides it to control inputs 43 and 76 of the master transconductance amplifier 41 and paired slave transconductance amplifier 78 respectively.

Numerous conditions can vary the predetermined difference, $\Delta X$, between the voltages across capacitors 47 and 48, creating an instability in the control loop 94 employed in system 40. Among these conditions are any change in: 1) the single or multi-bit word provided to DAC 84; 2) the amplitude of static source 80 or the amplitude of selectively variable source 82; or 3) any change in the temperature or any other ambient condition. Compensation signal $V_{comp}$ on line 72 varies in accordance with any deviation in predetermined difference ($\Delta X$) sensed by comparing circuit 58 to return system 40 to steady state. This compensation signal $V_{comp}$ on line 72 is provided, via feedback circuit 74, to the input terminal 43 of transconductance amplifier 41 and control input 76 of the slave transconductance amplifier 78 in transconductance filter 46.

Figure 6:
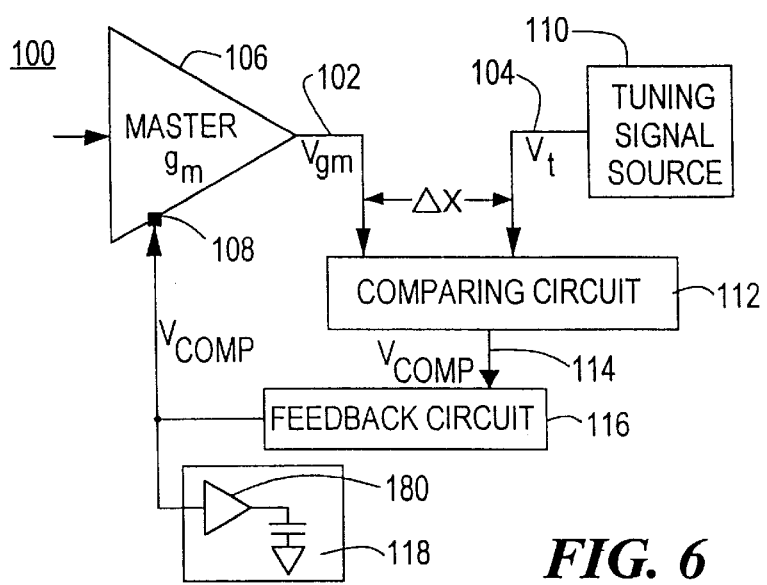
FIG. 6 is a diagrammatic view of another embodiment of the transconductance filter control system of this invention in which the output of the master transconductance amplifier and the tuning signal are voltages.

Although, thus far the invention has been disclosed in a current driven mode, this is not a limitation of the invention as voltage driven embodiments are also included. In another embodiment of the transconductance filter control system 100, FIG. 6, outputs $V_{gm}$ on line 102 and $V_t$ on line 104 are voltage signals. Control system 100 includes master transconductance amplifier 106 having an output $V_{gm}$ on line 102 which is a function of its transconductance. There is a control input 108 for controlling the transconductance of the master transconductance amplifier 106. Tuning signal source 110 provides tuning signal $V_t$ on line 104 which represents a preselected characteristic of the transconductance filter 118. Comparing circuit 112, responsive to any deviation from a predetermined difference $\Delta X$ between the tuning signal $V_t$ and the output $V_{gm}$ of the master transconductance amplifier 106, provides a compensation signal $V_{comp}$ on line 114. Feedback circuit 116 provides compensation signal $V_{comp}$ to the control input 108 of the master transconductance amplifier 106 and to continuous time transconductance filter 118. Compensation signal $V_{comp}$ adjusts the transconductance of both master and slave transconductance amplifiers 106 and 120 to restore the predetermined difference, $\Delta X$, between the tuning signal $V_t$ on line 104 and the output $V_{gm}$ on line 102 of the master transconductance amplifier 106.

Figure 7:
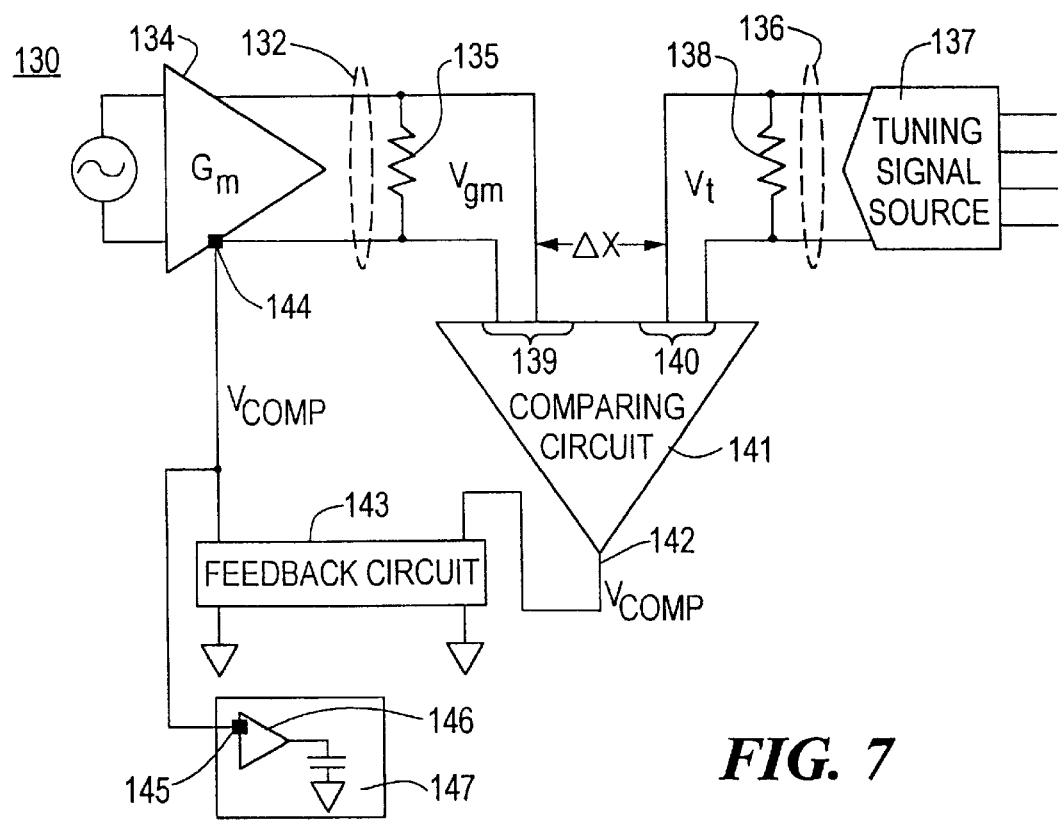
FIG. 7 is a schematic view of another embodiment of the transconductance filter control system of this invention in which the output of the master transconductance amplifier and the tuning signal are voltages.

In another voltage-based embodiment of the transconductance filter control system 130, FIG. 7, output $V_{gm}$ on lines 132 of master transconductance amplifier 134 is a voltage which is applied across a first load device, resistance 135. Tuning signal $V_t$ on lines 136 of tuning signal source 137 is a voltage which is applied across a second load device, resistance 138. These two signals $V_t$ and $V_{gm}$ are supplied to the first and second input channels 139 and 140 of comparing circuit 141 which generates a compensation signal $V_{comp}$ on line 142. This signal is provided, via feedback circuit 143, to control input 144 of transconductance amplifier 134 and control input 145 of paired slave transconductance amplifier 146 in transconductance filter 147.

During use, the transconductance of master transconductance amplifier 134 may vary due to changes in ambient conditions such as temperature, which varies the output $V_{gm}$ on line 132. Comparing circuit 141, which is responsive to the signals ($V_{gm}$ and $V_t$) sensed by input channels 139 and 140 and the resulting change in predetermined difference $\Delta X$, generates a compensation signal $V_{comp}$ on line 142. This signal $V_{comp}$, which is provided to transconductance amplifier 134 and transconductance filter 147, via feedback circuit 143, varies the transconductance gain of master transconductance amplifier 134, reestablishing the predetermined difference, $\Delta X$, and reestablishing steady state conditions.

Figure 8:
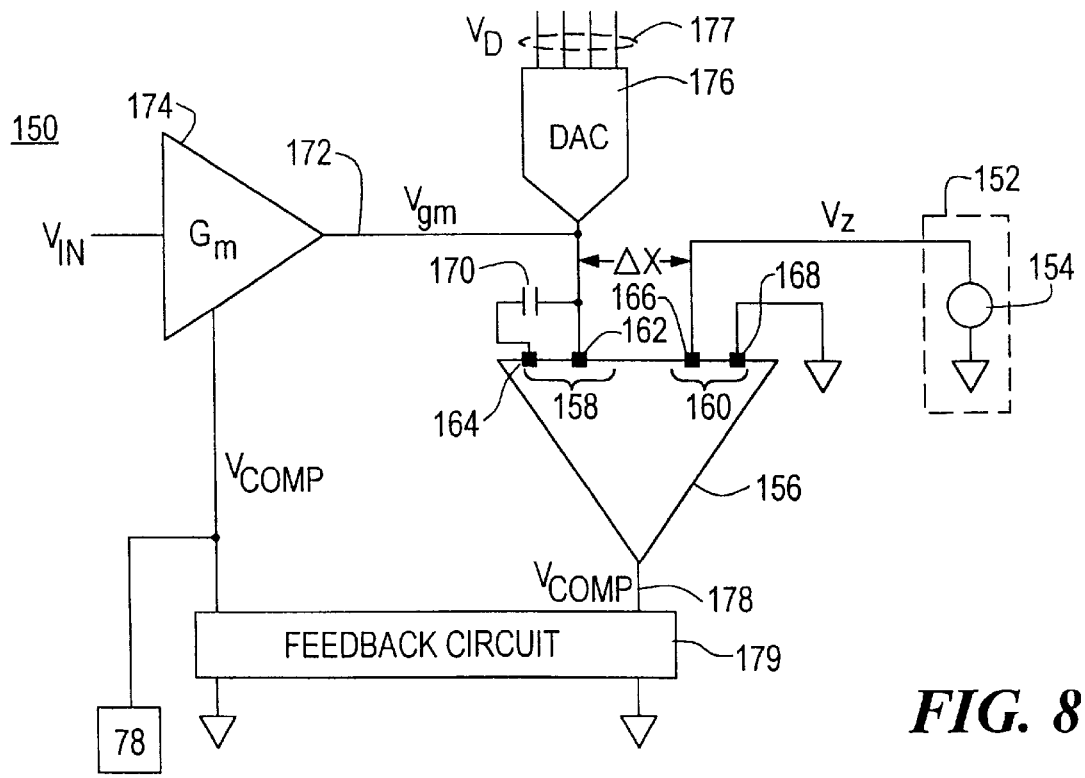
FIG. 8 is a schematic view of another embodiment of the transconductance filter control system of this invention in which the tuning signal source is a fixed voltage.

Another voltage based construction of the transconductance filter control system 150, FIG. 8, of this invention includes tuning signal source 152 which is a fixed voltage source 154. Comparing circuit 156 has first and second input channels 158 and 160: the first channel 158 has first and second input terminals 162 and 164 and the second channel 160 has first and second input terminals 166 and 168. A load device, capacitor 170 is applied across input terminals 162 and 164 of the first channel. Fixed voltage source 154 is applied across the first and second input terminals 166 and 168 of the second input channel 160. The output $V_{gm}$ on line 172 of the master transconductance amplifier 174 is applied to the first input terminal 162 of the first input channel 158. A digital to analog converter 176 is connected to this first input terminal 162 of this first input channel 158 to adjust the preselected characteristic of the transconductance filter 178. Digital to analog convertor 176 is responsive to a control signal $V_D$ on line 177 which varies the output of DAC 176. Any change in the output of digital to analog convertor 176 or any change in the temperature or any other ambient condition which affect transconductance gain of transconductance amplifier 174, as explained earlier, varies the voltage of capacitor 170. Therefore, compensation signal $V_{comp}$ on line 178 varies in accordance with this deviation in predetermined difference ($\Delta X$) sensed by comparing circuit 156 to adjust system 150 into steady state. Compensation signal $V_{comp}$ on line 178 is provided to master transconductance amplifier 174 and filter circuit 178 via feedback circuit 179.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A transconductance filter control system comprising:
   a master transconductance amplifier having an output which is a function of its transconductance and a control input for controlling the transconductance of said master transconductance amplifier;
   a tuning signal source for providing a tuning signal representative of a preselected characteristic of the transconductance filter;
   a comparing circuit, responsive to any deviation from a predetermined difference between said tuning signal and said output of said master transconductance amplifier, representative of a deviation of the transconductance of the master transconductance amplifier, for providing a compensation signal;
   a slave transconductance amplifier having an output which is a function of its transconductance and a control input for controlling the transconductance of said slave transconductance amplifier; and
   means for applying said compensation signal to said control input of said master transconductance amplifier and to said control input of said slave transconductance amplifier in the filter to adjust the transconductance of both said master and slave transconductance amplifiers and restore said predetermined difference between said tuning signal and said output of said master amplifier.

2. The transconductance filter control system of claim 1 in which said tuning signal source is a static source.

3. The transconductance filter control system of claim 1 in which said tuning signal source is a selectively variable source.

4. The transconductance filter control system of claim 1 in which said control system and said slave transconductance amplifier are CMOS circuits.

5. The transconductance filter control system of claim 1 in which said master and slave transconductance amplifiers are CMOS matched circuits.

6. The transconductance filter control system of claim 1 in which said master transconductance amplifier has a fixed input voltage.

7. The transconductance filter control system of claim 6 in which said fixed input voltage is a band-gap reference voltage.

8. The transconductance filter control system of claim 1 in which said comparing circuit includes a differential amplifier.

9. The transconductance filter control system of claim 1 in which said tuning signal source is a digital to analog converter.

10. The transconductance filter control system of claim 1 in which said predetermined difference is zero.

11. The transconductance filter control system of claim 1 in which said means for applying includes a current mirror circuit.

12. The transconductance filter control system of claim 1 in which said output of said master transconductance amplifier is a voltage applied across a first load device and said tuning signal is a voltage applied across a second load device.

13. The transconductance filter control system of claim 12 in which said first and second load devices are resistors.

14. The transconductance filter control system of claim 1 in which said output of said master transconductance amplifier and said tuning signal are current signals applied across a first and second load device.

15. The transconductance filter control system of claim 14 in which said first and second load devices are capacitors.

16. The transconductance filter control system of claim 15 in which said master transconductance amplifier has a first and second output terminal, said tuning signal source has a first and second output terminal, said comparing circuit has a first and a second input channel, each channel having a first and second input terminal, said first load device being applied across said input terminals of said first channel and said second load device being applied across said input terminals of said second channel.

17. The transconductance filter control system of claim 16 in which said first output terminals of said master transconductance amplifier and said tuning signal source are connected to said first input terminal of said first input channel and said second output terminals of said master transconductance amplifier and said tuning signal source are connected to said first input terminal of said second input channel.

18. The transconductance filter control system of claim 1 in which said tuning signal source is a fixed voltage source.

19. The transconductance filter control system of claim 18 in which said comparing circuit has a first and a second input channel, each channel having a first and second input terminal, where a load device is applied across said input terminals of said first channel.

20. The transconductance filter control system of claim 19 in which said load device is a capacitor.

21. The transconductance filter control system of claim 20 in which said fixed voltage source is applied across said first and second input terminals of said second input channel.

22. The transconductance filter control system of claim 21 in which said output of said master transconductance amplifier is applied to said first input terminal of said first input channel and a digital to analog converter is connected to said first input terminal of said first input channel to adjust said preselected characteristic of the transconductance filter.

* * * * *